Dec. 2, 1969 I. H. HAWLEY, JR 3,482,181
PHASE-LOCK FREQUENCY SHIFT COMPENSATION
Filed May 8, 1968
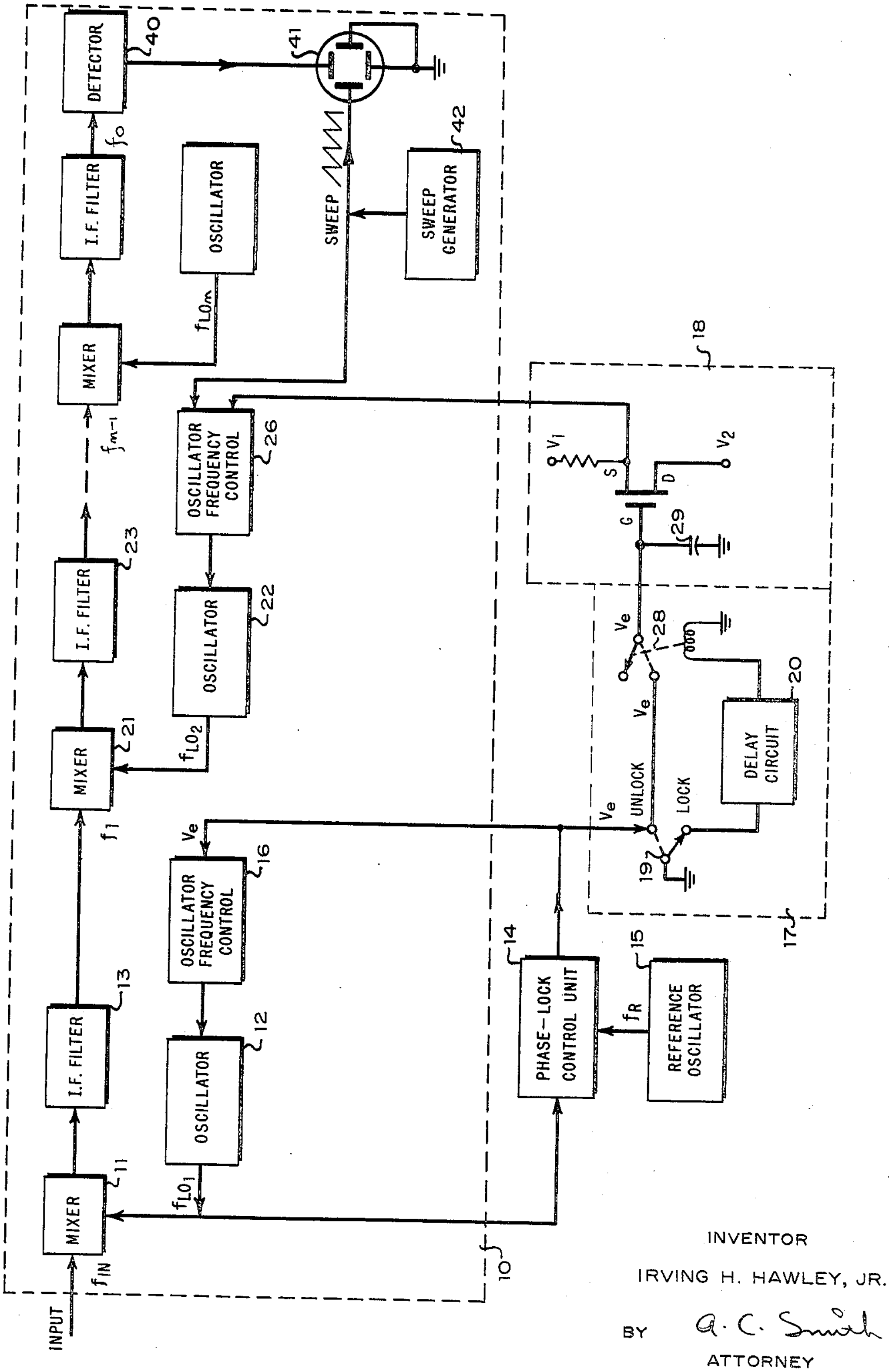
INVENTOR
IRVING H. HAWLEY, JR.
BY A. C. Smith
ATTORNEY United States Patent Office 3,482,181
Patented Dec. 2, 1969

3,482,181
PHASE-LOCK FREQUENCY SHIFT COMPENSATION

Irving H. Hawley, Jr., Palo Alto, Calif., assignor to Hewlett-Packard Company, Palo Alto, Calif., a corporation of California Filed May 8, 1968, Ser. No. 727,455
Int. Cl. H03b 3/04
U.S. Cl. 331—2 4 Claims

ABSTRACT OF THE DISCLOSURE

The output signal frequency of a multiple-conversion receiver such as a spectrum analyzer drifts as the output signal frequency of one of its local oscillators drifts. An automatic phase-lock control loop in which the output signal frequency of the first stage local oscillator is locked to a reference frequency eliminates this drift but may cause an initial shift in the output signal frequency of the receiver as phase lock is established. This initial shift is compensated for by applying to a controllable local oscillator in a subsequent stage of the receiver the initial phase-lock error voltage produced by phase-locking the first stage local oscillator to the reference frequency.

SUMMARY OF THE INVENTION

In accordance with the illustrated embodiment of the present invention, an initial shift in the output signal frequency of a multiple-conversion receiver caused by the phase-locking of the local oscillator in the first frequency conversion stage of the receiver to a harmonic of a reference frequency is compensated for by applying the initial phase-lock error signal to the local oscillator of a subsequent frequency conversion stage. This initial error signal is proportional to the frequency difference between the output signal frequency of the local oscillator in the first conversion stage and the harmonic of the reference frequency upon which phase lock is established and thus can be used in a subsequent conversion stage to cancel out the shift in output signal frequency upon establishment of phase lock in the first conversion stage.

BRIEF DESCRIPTION OF THE DRAWING

The figure is a schematic drawing of the circuit of the present invention.

DESCRIPTION OF THE PREFERRED EMBODIMENT

Referring to the drawing, there is shown a multiple-conversion receiver 10 having a first frequency conversion stage which includes mixer 11 having one input for receiving an applied signal $f_{IN}$ and having another input connected to receive the output signal $f_{LO1}$ from the first stage local oscillator 12. The resultant output signal frequency from the first stage mixer 11 represents the difference between the output signal frequency $f_{LO1}$ from the local oscillator 12 and the input signal frequency $f_{IN}$. This resultant signal is filtered by the first stage filter 13 and is then applied to the second stage mixer 21 where it is mixed with the output signal $f_{LO2}$ from the second stage local oscillator 22. The resultant output signal from the second stage mixer 21, which represents the difference between the resultant frequency $f_1$ and the output signal frequency $f_{LO2}$ from the second stage local oscillator 22, is then filtered by the second stage filter 23. This mixing and filtering may be continued for a selected number of stages *n* with each mixing stage followed by a filter which transmits a desired modulation product. The output signal of the last stage filter $f_0$ is then applied to the detector 40 which converts the output signal frequency $f_0$ to a voltage which is applied to the vertical deflection plate of the cathode ray tube 41. The sweep voltage produced by the sweep generator 42 is applied to the horizontal deflection plate of the cathode ray tube 41. The cathode ray tube display thus represents the amplitude of the detected frequency components of the input signal $f_{IN}$ at various frequencies in the spectrum displayed along the horizontal axis. The output signal frequency $f_0$ of the multiple-conversion receiver 10 thus represents a combination of the input signal frequency $f_{IN}$ and the output signal frequencies from the local oscillators in the frequency conversion stages which comprise the receiver. This combination may be represented by the formula $f_0=f_{LO1}-f_{IN}-f_{LO2}\ .\ .\ .\ -f_{LOn}$. Frequency drift, which occurs predominantly in the local oscillator of the first stage, thus produces a change in the output signal frequency $f_0$, which change in frequency thus appears as a shift along the horizontal axis of the cathode ray tube 41 of the position of a selected frequency component of the input signal $f_{IN}$.

In order to prevent the first stage local oscillator 12 from drifting and causing the output signal frequency $f_0$ to change and produce a lateral shift of the display, an automatic phase lock control unit 14 is used to phase-lock the output signal frequency $f_{LO1}$ of the first stage local oscillator 12 to a harmonic of a reference frequency $f_R$ produced by the reference oscillator 15. The output of the phase-lock control unit 14 is a phase-lock error voltage $V_e$ that is proportional to the error frequency $f_e$ which represents the difference between the harmonic of the reference frequency $f_R$ and the output signal frequency $f_{LO1}$ of the first stage local oscillator 12 just before phase lock is established. When the switch 19 is in the UNLOCK position, the automatic phase-lock control unit 14 is grounded and the first stage local oscillator 12 is free to change frequency. When the switch 19 is in the LOCK position, the phase-lock control loop is closed by applying the phase-lock error voltage $V_e$ to the oscillator frequency control unit 16 which produces a tuning voltage for tuning the first stage local oscillator 12 to produce an output signal frequency $f_{LO1}$ that is phase-locked to a harmonic of the reference frequency $f_R$. Although this phase lock arrangement eliminates drift in the first stage local oscillator, the shift in the output signal frequency of the first stage local oscillator 12 from $f_{LO1}$ to a harmonic of the reference frequency $f_R$ to establish phase lock also produces a shift in the output signal frequency $f_0$ of the receiver. In order to compensate for this shift, the initial error voltage $V_e$ is also applied through stabilizer switching circuit 17 and analog memory 18 to the oscillator frequency control unit of a subsequent stage of the receiver, thereby shifting the output signal frequency $f_{LO2}$ of the local oscillator 22 by the same amount as the initial shift in the output signal frequency $f_{LO1}$ of the first stage local oscillator 12. This shift in the output signal frequency $f_{LO2}$ of the local oscillator 22 cancels the shift in the output signal frequency $f_{LO1}$ of the first stage local oscillator 12 since the output signal frequency $f_{LO2}$ is subtracted from the output signal frequency $f_1$ of the first stage. This may be seen in the following equation:

$$f_2=f_1-f_{LO2}=(f_{LO1}-f_{IN})-f_{LO2}$$

Thus, if $f_{LO2}$ is shifted by the same amount that $f_{LO1}$ is shifted, the negative sign before the second stage local oscillator output signal frequency $f_{LO2}$ causes a cancellation of the shift in the output signal frequency $f_{LO1}$ of the first stage local oscillator 12. When the switch 19 is in the UNLOCK position, the automatic phase-lock control unit 14 is grounded and the relay 28 of the stabilizer switching circuit 17 is closed. Thus, the common connection between the capacitor 29 and the gate of the field effect transistor 30 is grounded. When the switch 19 is placed in the lock position, the error voltage $V_e$ is applied to the common connection between the capacitor 29 and the gate of the field effect transistor 30. The delay circuit 20 causes the relay 28 to open after a selected time interval, say one second. Switching transients in the error voltage $V_e$ thus average out over the selected time interval leaving the capacitor 29 charged to the initial value of the phase-lock error voltage $V_e$. The relay 28 must be opened after this given delay period so that the initial value of the phase-lock error voltage $V_e$ (which is constantly changing due to the tendency of the natural frequency of the first stage local oscillator to drift with time and temperature) is not altered by mere drift-correcting signals in the phase-locked circuit. The initial phase-lock error voltage $V_e$, which is amplified by the field effect transistor 30 and applied to the oscillator frequency control unit 26 of the subsequent stage of the receiver, thus causes a shift in the output signal frequency $f_{LO2}$ of the local oscillator 22 of sufficient magnitude and direction relative to the initial shift caused by the phase-locking of the first stage local oscillator to a harmonic of the reference frequency $f_R$ to eliminate shift in output frequency $f_0$ at the time the phase-lock of the first stage local oscillator is established.

I claim:

1. In a signalling circuit including a plurality of frequency conversion stages, each including a controllable oscillator, apparatus for stabilizing the output frequency of the signalling circuit against changes caused by the phase locking to a reference frequency of a controllable oscillator in a frequency conversion stage, the apparatus comprising:

first and second frequency conversion stages coupled together to produce an output frequency of the signalling circuit as the combination of signal frequencies applied to said stages, each of said stages including a signal-controllable oscillator;

an input connectable to a signal source for receiving a reference frequency;

circuit means connected to said input and to a controllable oscillator in one of said conversion stages for producing a control signal related to the difference between a selected multiple of the reference frequency and the frequency of said one of the controllable oscillators;

memory means for storing a control signal;

stabilizer switching means connected to said circuit means for selectively applying said control signal to said one controllable oscillator for establishing phase lock between the signal frequency of said one controllable oscillator and the selected multiple of the reference frequency and for applying said control signal to said memory means for a selected period of time, said stabilizer switching means disconnecting said memory means from said circuit means after said selected period of time; and means connected to the memory means for applying to the other of said controllable oscillators a correction signal related to the signal on said memory means for altering the frequency of said other controllable oscillator an amount and in a direction to substantially cancel the effect of frequency changes of said one controllable oscillator upon the output frequency from the coupled first and second frequency conversion stages as phase lock is selectively established between said selected multiple of the reference frequency and the frequency of said one controllable oscillator.

2. Apparatus as in claim 1 wherein the signalling circuit includes the first frequency conversion stage which is connectable to receive an input signal;

the controllable oscillator associated with said first conversion stage is selectively phase locked to a selected multiple of the reference signal; and said correction signal is applied to the other of said controllable oscillators associated with said second frequency conversion stage.

3. Apparatus as in claim 1 wherein the stabilizer switching means comprises:

first switching means capable of operating in one operating state for applying said control signal to the memory means from said circuit means, and in a second operating state for disconnecting the memory means from said circuit means for storing a control signal;

delay means capable of operating the first switching means in the first and second operating states; and second switching means connected to said circuit means and capable of operating in one operating state to prevent establishment of phase lock between said one controllable oscillator and the selected multiple of the reference frequency, and in a second operating state to estabish phase lock therebetween and to apply said control signal to the memory means and also to actuate said delay means for disconnecting said memory means from said circuit means after said selected period of time.

4. Apparatus as in claim 1 wherein the memory means comprises:

a field effect transistor having source and drain electrodes and having an insulated gate electrode connected to the output of the stabilizer switching means for receiving a control signal from said circuit means; and a capacitor connected to said gate electrode for storing a control signal applied thereto from the stabilizer switching means.

References Cited

UNITED STATES PATENTS

| | | | |
|---|---|---|---|
| 2,743,362 | 4/1956 | Leed | 331—22 X |
| 2,775,701 | 12/1956 | Israel | 331—22 X |
| 2,964,714 | 12/1960 | Jakubowics | 331—2 |

ROY LAKE, Primary Examiner

S. H. GRIMM, Assistant Examiner

U.S. Cl. X.R.

331—17, 19, 22, 39; 324—79